United States Patent [19]

Furuyama et al.

[11] Patent Number: 4,686,456
[45] Date of Patent: Aug. 11, 1987

[54] MEMORY TEST CIRCUIT

[75] Inventors: Tohru Furuyama, Tokyo; Takashi Ohsawa, Kawasaki, both of Japan

[73] Assignee: Kabushiki Kaisha Toshiba, Kawasaki, Japan

[21] Appl. No.: 846,143

[22] Filed: Mar. 31, 1986

[30] Foreign Application Priority Data

Jun. 18, 1985 [JP] Japan ................................ 60-132597
Jun. 18, 1985 [JP] Japan ................................ 60-132596

[51] Int. Cl.⁴ ...................... G01R 31/26; G11C 29/00
[52] U.S. Cl. ..................................... 324/73 R; 371/21
[58] Field of Search .................. 324/73 R, 158 R; 371/21

[56] References Cited

U.S. PATENT DOCUMENTS 3,351,905  11/1967  Kramer ................................. 371/21
3,420,991   1/1969  Ling .................................... 371/21

FOREIGN PATENT DOCUMENTS 55129  6/1982  European Pat. Off. ............. 371/21

OTHER PUBLICATIONS

"A 90ns 1Mb DRAM with Multi-Bit Test Mode" ISSCC 85, pp. 240-241 M. Kumanoya, et al. 2/15/85.

Primary Examiner—Reinhard J. Eisenzopf
Assistant Examiner—Stephen M. Baker
Attorney, Agent, or Firm—Oblon, Fisher, Spivak, McClelland & Maier

[57] ABSTRACT

A memory test circuit in which test data is simultaneously written into plural memory cells of a semiconductor memory device and then subsequently read from the plural memory cells to assure reliable operation of the memory device. A logical sum and a logical product are formed of the test data read out from the plural memory cells. The logical product and the logical sum are subjected to an exclusive-or operation, the result of which is indicative of whether or not the test data was correctly written into the memory cells.

3 Claims, 12 Drawing Figures

MEMORY TEST CIRCUIT

BACKGROUND OF THE INVENTION

(1) Field of the Invention

This invention relates to a memory test circuit and, in particular to the memory test circuit to inspect simply and quickly whether or not the memory devices operate correctly.

(2) Description of the Prior Art

In the past few years, the degree of integration of semiconductor integrated circuit devices, particularly semiconductor memory devices, has increased at a spectacular pace. However, when there is an increase in the number of memory cells on one chip, i.e., in the amount of information recorded, inspecting whether or not these memory cells are functioning correctly becomes correspondingly more difficult, and requires a vast amount of time. This tendency is especially large on a single-bit memory. Because of this, a method of simplifying the testing, reducing testing time ($\frac{1}{4}$, $\frac{1}{8}$) by inspecting a single-bit memory 4 or 8 bits at a time as if it were multi-bit (x4, x8, etc), is coming into use. This method is introduced in, for example, 'ISSCC 85 Technical Digest p. 240 "A 90 ns 1 Mb DRAM with Multi-Bit Test Mode"'.

And when there is a increase in the number of memory chips to be inspected simultaneously, in proportion as amount of information recorded on the chip are large, the inspection becomes corresponding more difficult and requires a vast of time.

In existing test simplification methods, however, the testing time is reduced mainly during chip quality selection while still at the wafer stage by setting up additional test output terminals (pads) on the chip, and inspecting multi-bit memory cell by reading the written data from these output terminals. For this reason, this method has the disadvantage of not being applicable to the individual finished products after assembly.

The method of testing by simultaneously reading written data from 4 memory cells and taking the logical product is proposed in the article mentioned above. However, this type of method has the disadvantage that complete inspection cannot be carried out. This is because, although when the data written is "1", then if all the cells are correct, the logical product will be "1" and if only one of the memory cells is faulty, the logical product will be "0", allowing faults to be detected, on the other hand, when the data written is "0", if the output from only one of the memory cells is "0", then the logical product will be "0", giving a "non-faulty" decision.

SUMMARY OF THE INVENTION

The present invention is made based on the above circumstances, the object of this invention are to also enable inspection at the finished product level after assembly, and to provide a memory test circuit which completely inspects the memory cell operation in a short time.

In order to achieve the above object, this invention inspects whether or not each memory cell is operating correctly by writing indentical data into several (e.g. 4, 8, etc.) memory cells, calculating a first logical operation and a second logical operation of the data read from these memory cells, inspecting of whether or not the memory cells having written test data operate correctly is carried out on the basis of the first logical operation and second logical operation of the test data read from the memory cells.

And the first logical operation is a logical product and the second logical operation is a logical sum of the data read from these memory cells, then this invention inspects whether or not each memory cell is operating correctly by obtaining the exclusive logical sum of the logical product and logical sum, and examining this exclusive logical sum.

Furthermore, in order to achieve the above object, this invention inspects whether or not each memory cell is operating correctly by calculating the logical product and the logical sum of the data read from these memory cells, and making a comparison to discover if they agree with the data written.

DESCRIPTION OF THE PREFERRED EMBODIMENTS

Figure 1:
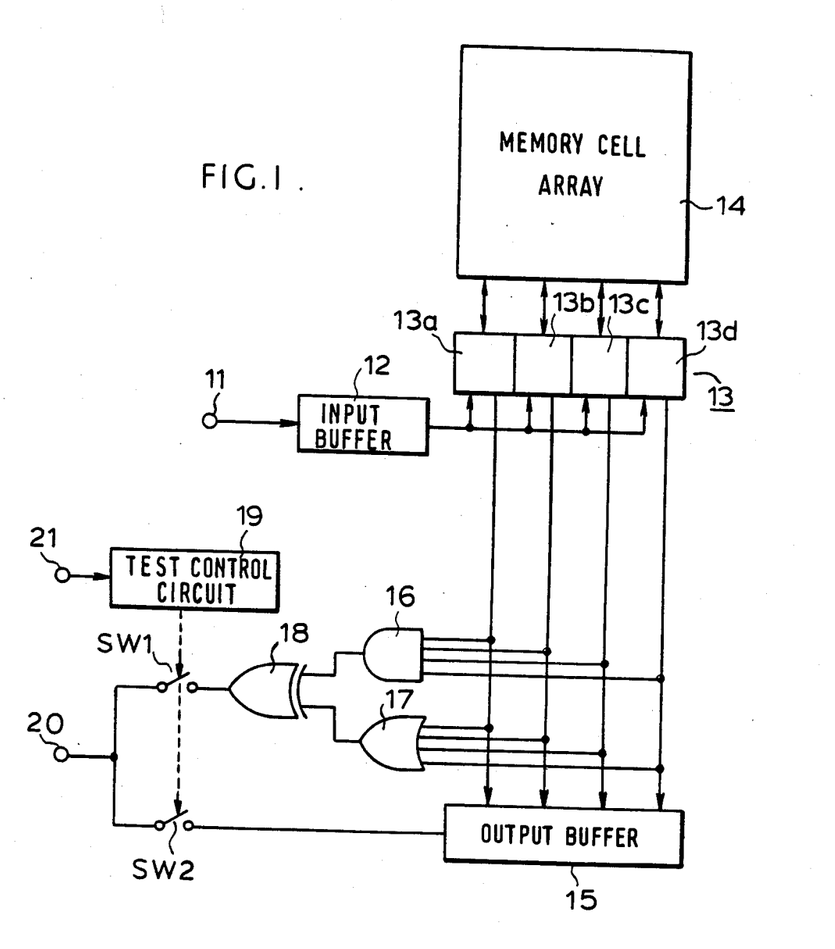
FIGS. 1 and 2 show an embodiment of the memory test circuit according to the invention.
Figure 2:
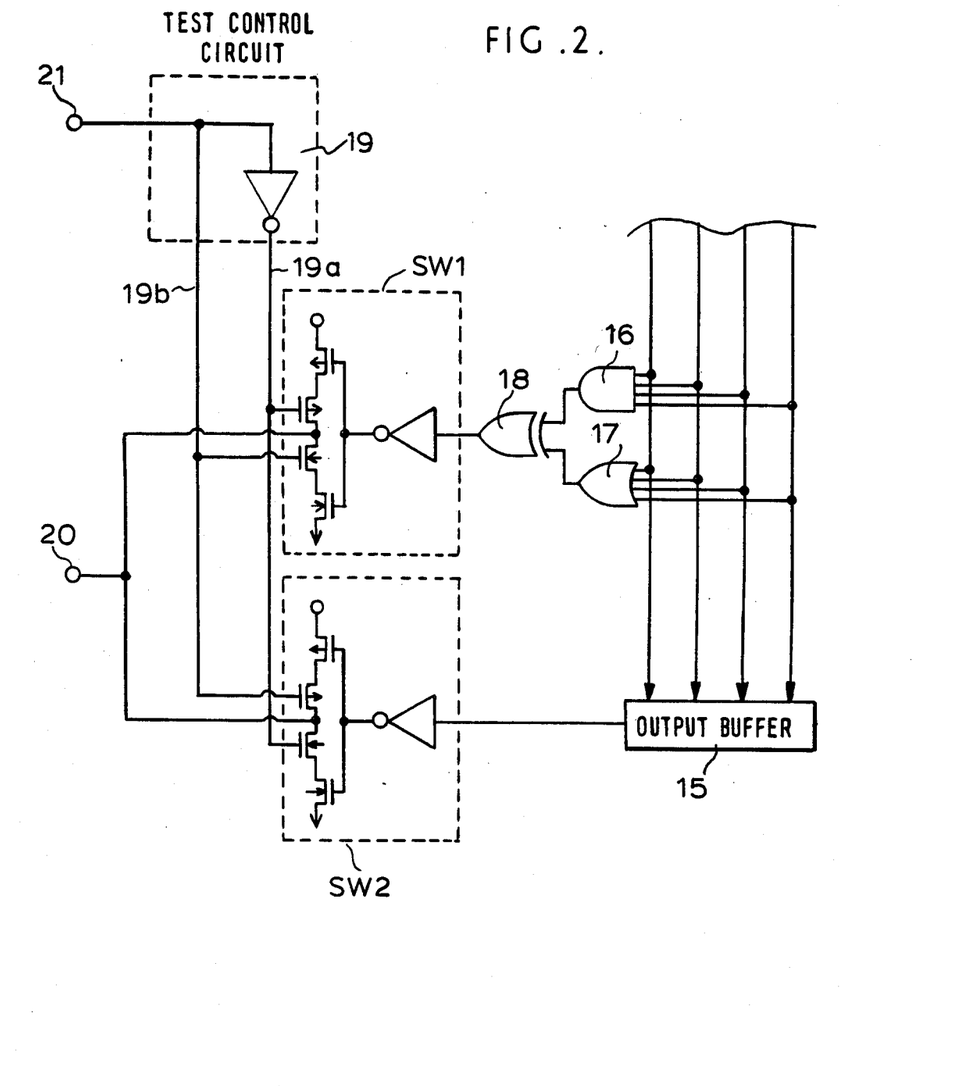

An embodiment of the invention is described with reference to FIGS. 1 and 2. FIG. 1 shows only the flow of data in the memory, and omits the flow of address-related signals.

The write data supplied to a data input terminal 11 is supplied to an input-output circuit 13 through an input buffer 12. The write data supplied to input-output circuit 13 is written to specific memory cells in memory cell array 14 selected by the row decoder and the column decoder which are not shown in the drawing. The data read from memory cell array 14, in addition to being read into an output buffer 15 through input-output circuit 13, is supplied to both an AND circuit 16 and an OR circuit 17. The outputs of an AND circuit 16 and an OR circuit 17 are each supplied to EXCLUSIVE-OR circuit 18. The outputs of EXCLUSIVE-OR circuit 18 and output buffer 15 are output selectively from a common data output terminal 20 through switches SW1 and SW2 which are switched ON/OFF in accordance with the output of a test control circuit 19. Test control circuit 19 is controlled by means of test control signals supplied by test control signal input terminal 21.

Next, the operation of an above construction is described with reference to FIGS. 1 and 2. Firstly, normal writing and reading operations are described. The write data which is input by data input terminal 11 is transmitted to input-output circuit 13 through input buffer 12. At input-output circuit 13, one in four input-output circuits 13a–13d is activated in correspondence to an address given to memory cell array 14 from the row decoder and column decoder, and the input data is written to the memory cell in the corresponding address connected to this input-output circuit. When the data is read, the memory data in 4 memory cells are transmitted to input-output circuits 13a–13d, and to output buffer 15. Only one data unit from output buffer 15, corresponding to the selected address, is output from common data output terminal 20 through switch SW2. At this point, as shown in FIG. 2, the test control circuit 19 is controlled by means of test control signals supplied by test control signal input terminal 21. Switch SW1 is set to OFF and switch SW2 is set to ON in accordance with the outputs 19a, 19b of test control circuit 19. By doing this, AND circuit 16, OR circuit 17, and EXCLUSIVE-OR circuit 18, which work as a test circuit, are all non-operational, or can be considered not to affect the data output.

During testing, switch SW1 is set to ON and switch SW2 is set to OFF in accordance with the outputs 19a, 19b of test control circuit 19. Test input data (identical test input data) from data input terminal 11 is written to 4 memory cells through input buffer 12 and input-output circuits 13a–13d. Next, the test input data written in the 4 memory cells are simultaneously read and supplied to AND circuit 16 and OR circuit 17 through input-output circuit 13a–13d. The logical product and logical sum data output from AND circuit 16 and OR circuit 17 are both supplied to EXCLUSIVE-OR circuit 18 to check whether or not they agree. The relationships between the memory cell data and the outputs of each of the circuits are shown in Table 1 below.

TABLE 1

| Data in 4 memory cells | ALL "1" | All "0" | Mixture of "1" and "0" |
|---|---|---|---|
| Output of And circuit 16 | "1" | "0" | "0" |
| Output of OR circuit 17 | "1" | "0" | "1" |
| Output of EXCLUSIVE-OR circuit 18 | "0" | "0" | "1" |

As shown in Table 1, when the data read from 4 memory cells is all "1" or all "0", the output of EXCLUSIVE-OR circuit 18 is "0", and when there is a mixture of "1" and "0" in the read out data, the output of EXCLUSIVE-OR circuit 18 is "1". Since a mixture of "1" and "0" in the data from the memory cells signifies faulty operation, an output of "0" from EXCLUSIVE-OR circuit 18 indicates normal operation, and "1" indicates faulty operation.

With this type of construction, since external terminals are set up for testing purposes, testing is also possible at the finished product level after assembly, and because identical test input data is written to several (for example 4) memory cells; and the logical product and logical sum of data read from these memory cells are obtained, and then the exclusive logical sum of the logical product and logical sum is taken to see whether or not they agree, complete inspection of the memory cell operation is possible, simply by monitoring the output of EXCLUSIVE-OR circuit 18. Moreover, since several (4) memory cells can be inspected simultaneously, inspection time is shorter than if individual memory cells are inspected one at a time.

Figure 3:
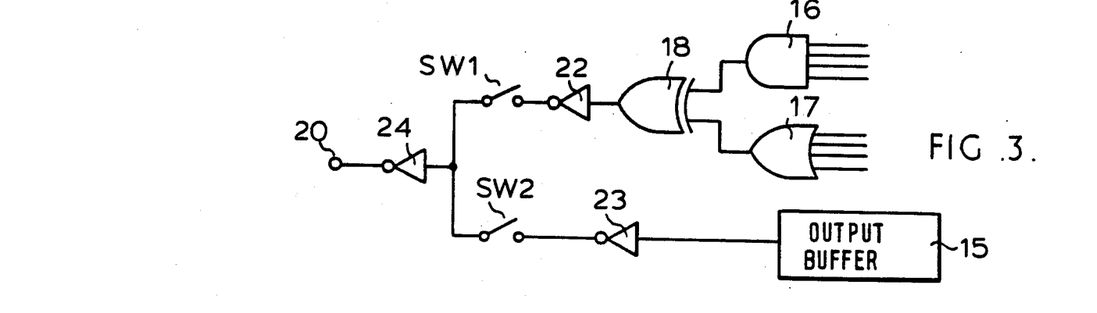
FIGS. 3–6 each show different embodiments of this invention.
Figure 4:
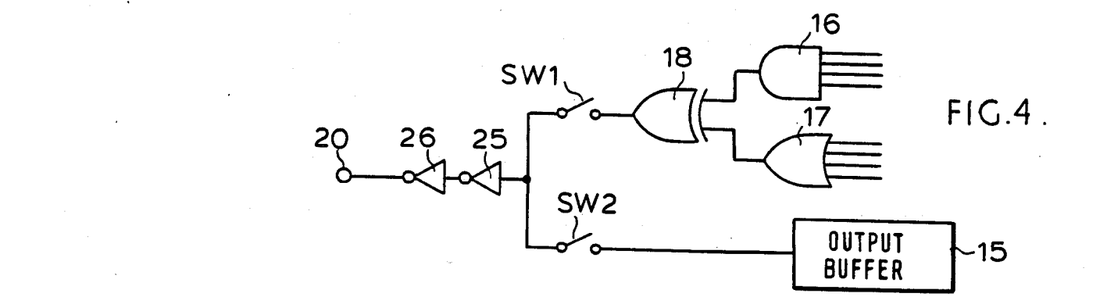
Figure 5:
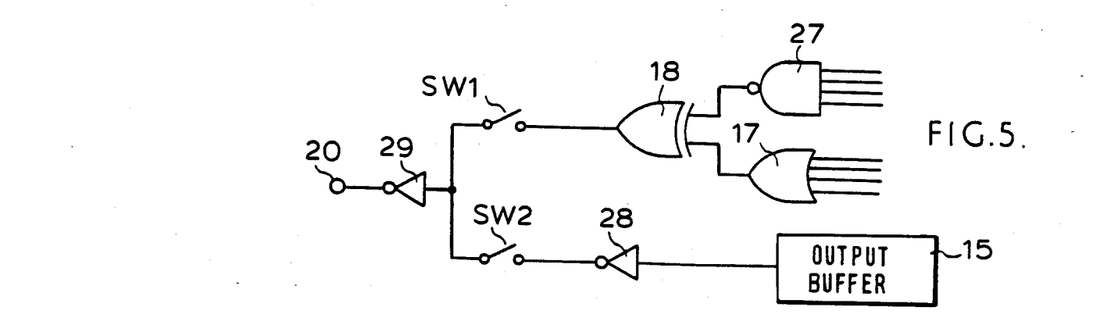
Figure 6:
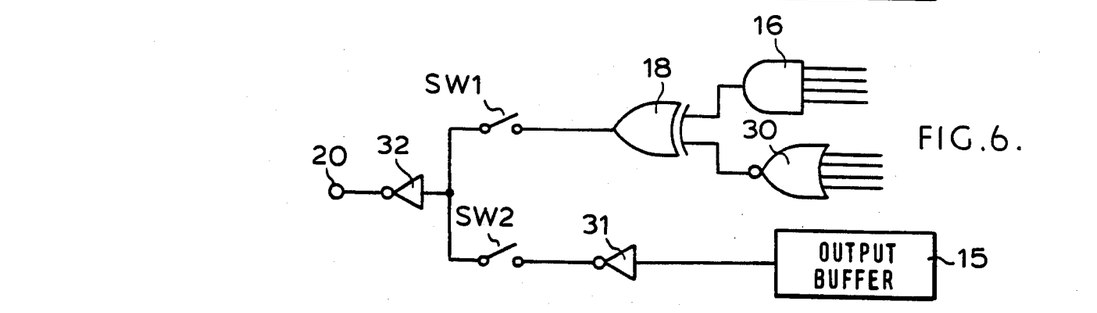

FIGS. 3–6 show other embodiments of this invention. With these circuits, sufficient drive is possible, even if common data output terminal 20 is connected to a large external load. In FIG. 3, inverters 22–24 are installed on the output terminal of EXCLUSIVE-OR circuit 18, the output terminal of output buffer 15, and between switches SW1, SW2 and common data output terminal 20. Further, in the circuit shown in FIG. 4, inverters 25, 26 are installed between switches SW1, SW2 and common data output terminal 20. In the circuit shown in FIG. 5, in addition to installing a NAND circuit 27 in place of AND circuit 16, inverters 28, 29 are installed on the output terminal of output buffer 15 and between switches SW1, SW2 and common data output terminal 20. Furthermore, in the circuit shown in FIG. 6, in addition to installing a NOR circuit 30 in place of OR circuit 17, inverter 31 is installed on the output terminal of output buffer 15 and inverter 32 is installed between switches SW1, SW2 and common data output terminal 20.

The types of construction shown in FIGS. 3–6 operate in the same way as the circuit shown in FIG. 1 above, and, of course, give the same results.

In the above embodiments, writing identical data simultaneously to 4 memory cells is described, but it goes without saying that they are also applicable to different numbers (for example 8 memory cells). Also, an output signal is obtained from common data output terminal 20 by selecting the output from EXCLUSIVE-OR circuit 18 or the output from the output buffer 15 by means of switches SW1, SW2, but, of course, separate terminals may be set up for each of the output signals. Furthermore, this invention is not just applicable to semiconductor memory devices, but may also be applied to memory blocks in CPU chips, etc.

In order to apply this invention, it is necessary to add AND circuits, OR circuits, EXCLUSIVE-OR circuits, switches, etc., but increases in pattern area and circuit complexity are insignificant, and can be virtually disregarded.

Figure 7:
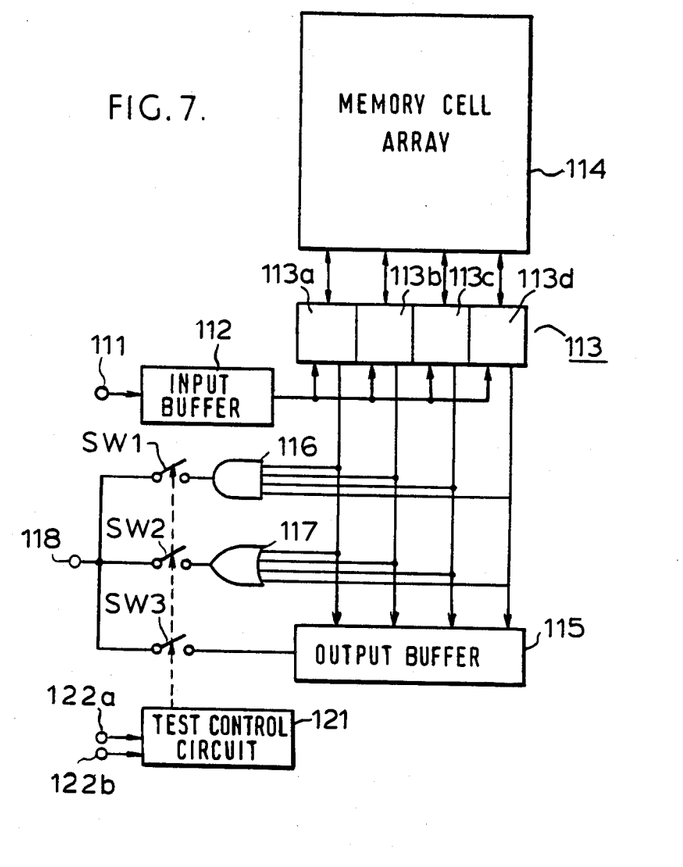
FIGS. 7–10 show other embodiments of the memory test circuit to which this invention relates.

Other embodiment of the invention is described with reference to FIGS. 7 and 8. FIG. 7 shows only the flow of data in the memory, and omits the flows of address-related signals in the same way as the circuit shown in FIG. 1.

The write data supplied to a data input terminal 111 is supplied to an input-output circuit 113 through an input buffer 112. The write data supplied to input-output circuit 113 is written to specific memory cells in memory cell array 114 selected by the row decoder and the column decoder which are not shown in the drawing. The data read from memory cell array 114, in addition to being read into an output buffer 115 through input-output circuit 113, is supplied to both an AND circuit 116 and an OR circuit 117. The output of AND circuit 116 is supplied to a common data output terminal 118 through switch SW1, and output of OR circuit 117 is supplied to common data output terminal 118 through switch SW2. The output of output buffer 115 is supplied to common data output terminal 118 through switch SW3. ON/OFF control of the switches SW1–SW3 is performed selectively by the output of test control circuit 121. Test control circuit 121 is controlled by means of test control signals supplied by test control signal input terminal 122a, 122b.

Next, the operation of an above construction is described with reference to FIGS. 7 and 8. Firstly, normal writing and reading operations are described. The write data which is input by data input terminal 111 is transmitted to input-output circuit 113 through input buffer 112. At input-output circuit 113, one in four input-output circuits 113a–113d is activated correspond to an address given to memory cell array 114 from the row decoder and column decoder, and the input data is written to the memory cell in the corresponding address connected to this input-output circuit. When the data is read, the memory data in 4 memory cells are transmitted to input-output circuits 113a–113d, and then transmitted to output buffer 115. Only one data unit from output buffer 115, corresponding to the selected address, is output from common data output terminal 118 through switch SW3. At this point, test control circuit 121 is controlled by means of test control signals supplied by test control signal input terminal 122*a*, 122*b*. The control signal "0" is input to test control signal input terminal 122*b*. Switch SW1, SW2 are set to OFF in accordance with the output "0" of output terminals 122*c*, 122*d* and switch SW3 is set to ON in accordance with the output "1" of an output terminal 122*e*. By doing this, AND circuit 116 and OR circuit 117, which work as a test circuit, are all non-operational, or can be considered not to affect the data output.

Figure 8:
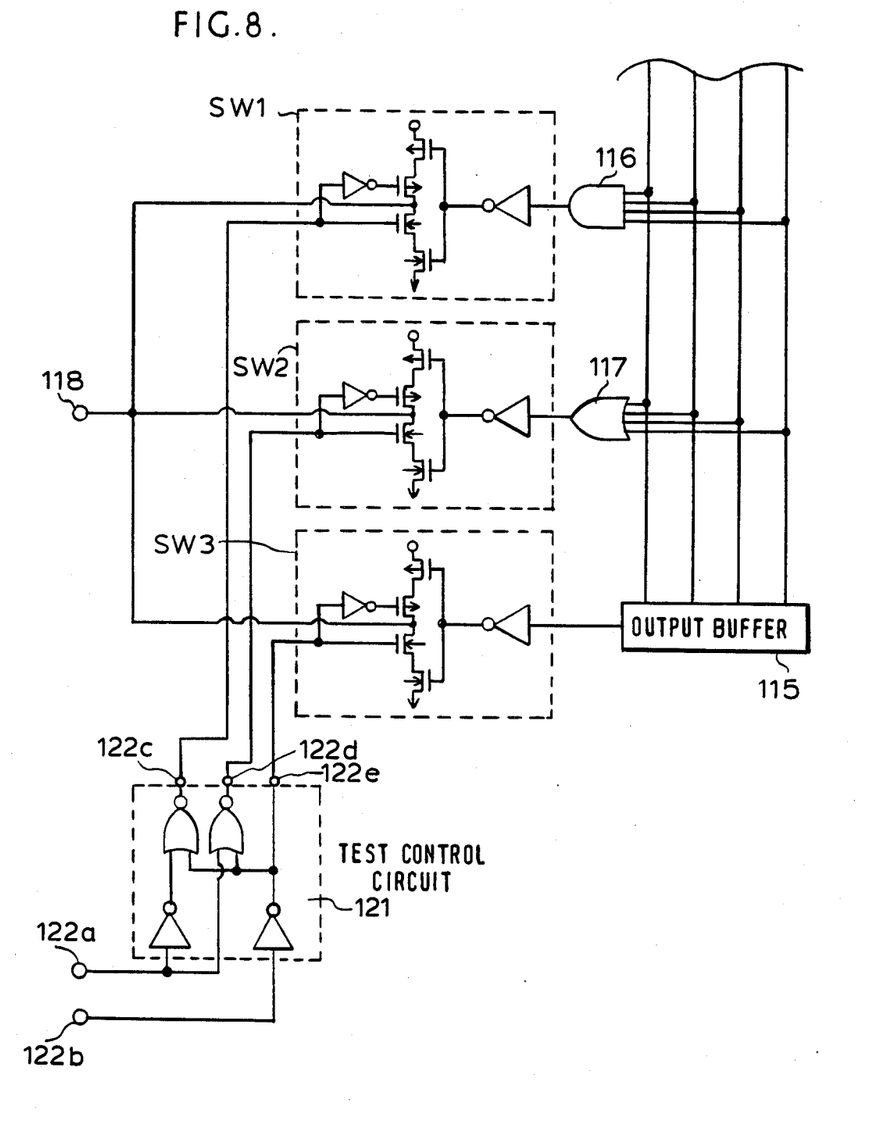

During testing, as shown in FIG. 8, signal "0" or "1" is input to test control signal input terminal 122*a* and signal "1" is input to test control signal input terminal 122*b*. Switch SW1 or SW2 are set to ON or OFF in accordance with the outputs of output terminals 122*c*, 122*d*. Switch SW3 is set to OFF in accordance with the output of output terminal 122*e* and isolates output buffer 115 from common data output terminal 118. Test input data (identical test input data) from data input terminal 111 is written to 4 memory cells through input buffer 112 and input-output circuits 113*a*-113*d*. Next, the test input data written in the 4 memory cells are simultaneously read and supplied to AND circuit 116 and OR circuit 117 through input-output circuit 113*a*-113*d*. The logical product and logical sum data output from AND circuit 116 and OR circuit 117 are output by common data output terminal 118 through switches SW1 and SW2 respectively. The logical product and logical sum data output from AND circuit 116 and OR circuit 117 are compared with the test input data and the 4 memory cells are only judged to be operating correctly if there is complete agreement.

And the output to SW1, SW2 from test control circuit 121 is controlled by the test input data to input terminal 112*a*. When the test input data is "1", a signal "1" is input to terminal 122*a*, switch SW1 set to ON and switch SW2 set to OFF. Then the output from AND circuit 116 is output from common data output terminal 118. Conversely, when the test input data is "0", a signal "0" is input to terminal 122*a*, switch SW2 is set to ON, switch SW1 is set to OFF, and the output from OR circuit 117 is output from common data output terminal 118. When the test input data is "1", the data read from each of the 4 memory cells should be "1" in each case, but if even one of them has become "0" through malfunction, the logical product output from AND circuit becomes "0". Consequently there is no need to check the logical sum. On the other hand, when the test data is "0" the data read from each of the 4 memory cells should be "0" in each case, which is the reverse of the above situation. If even one of them has become "1", the logical sum becomes "1". Consequently there is no need to check the logical product. It is sufficient just to compare the output of OR circuit 117 with the test input data. Taking note of this, in this embodiment the outputs of AND circuit 116 and OR circuit 117 are output selectively in accordance with the test input data.

With this type of construction, since external terminals are set up for testing purposes, testing is also possible at the finished product level after assembly, and because identical test input data is written to several (4) memory cells, and the logical product and logical sum of data read from these memory cells are taken and compared with the test input data, complete inspection of the memory cell operation is possible. Moreover, since 4 memory cells can be inspected simulteneously, inspection time is shorter than if individual memory cells are inspected one at a time.

With the sort of construction shown in FIG. 7, terminals 118, 122*a*, and 122*b* are not used in normal operation, but instead of setting up these terminals separately, they can also be used together with other terminals. For example, common data output terminal 118 can double with the existing data output terminal and with terminals made unnecessary by reading data from or writing data to 4 memory cells simultaneously. In addition, input terminal 122*a*, 122*b* inputted the test control signal which determines whether or not test control circuit 121 is activated need not be set up separately if, for example, a high voltage outside the range normally used is applied to an unused address terminal. Furthermore, terminals 118, 119 may be separated and the logical product output and logical sum output obtained separately.

Figure 9:
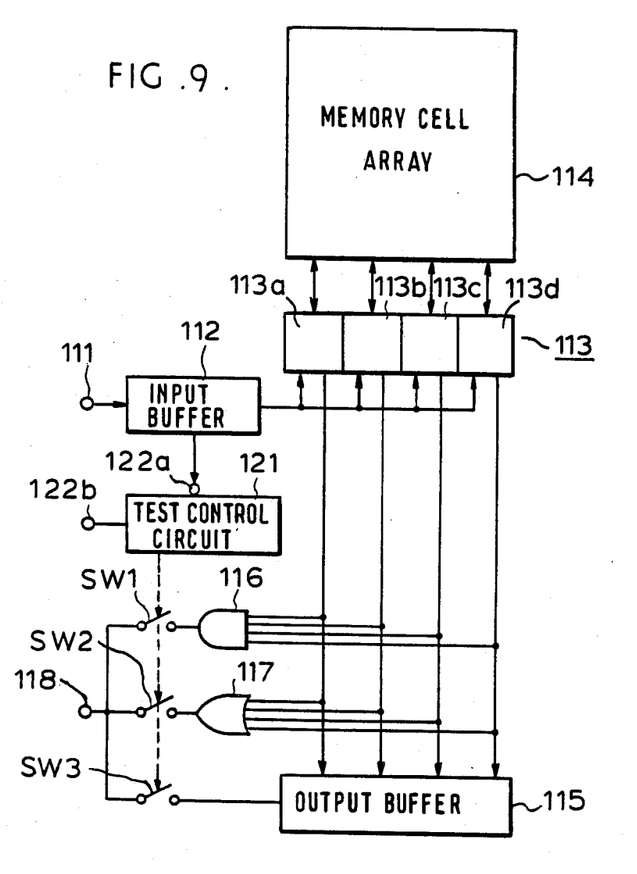
Figure 10:
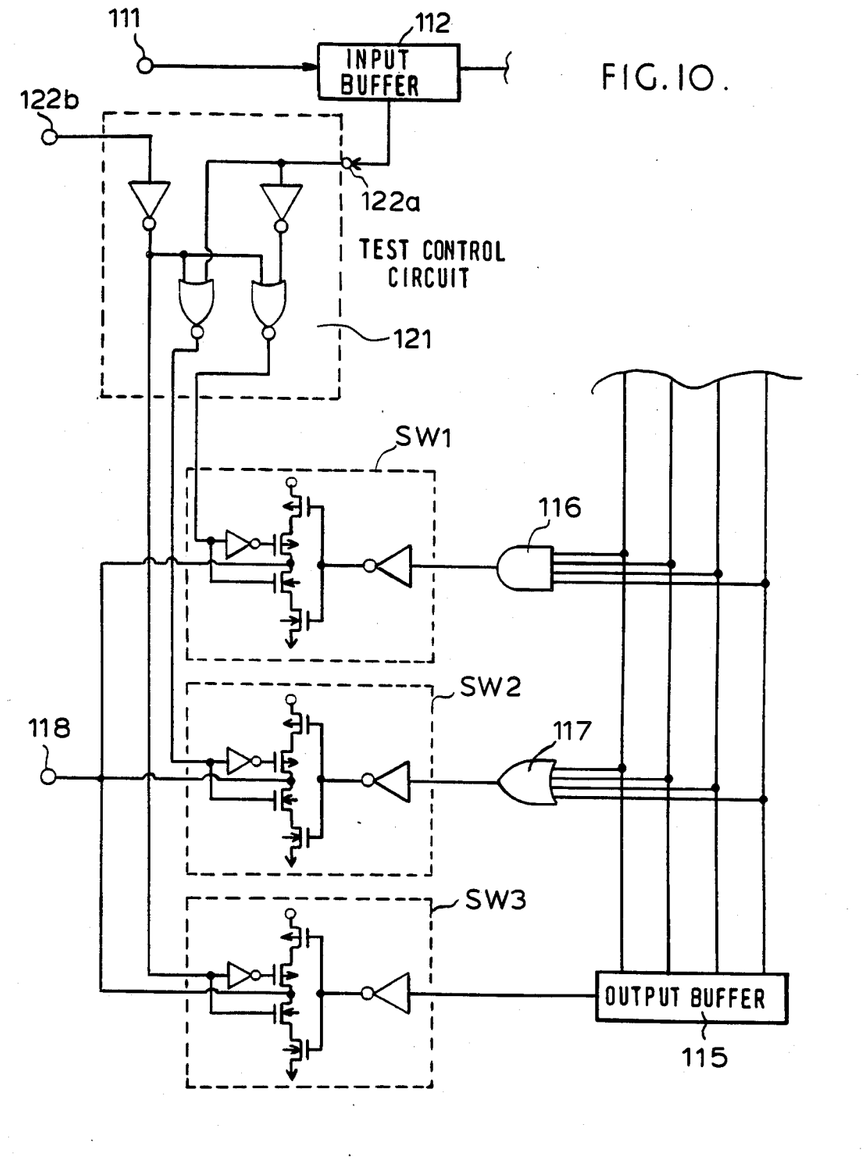

FIGS. 9 and 10 shows other embodiment of the invention. Where components are identical to those in FIG. 7, they are given the same numbers and a detailed description is omitted. Test control circuit 121 is controlled on the basis of the test control signal input by test control signal input terminal 122 and test input data output from input buffer 112. Accordingly, the outputs from AND circuit 116, OR circuit 117 and output buffer 115 are output from common data output terminal 123, according to the operational state, normal operation or test operation, and according to the input data during test operation.

With the above construction, normal operation is the same as in FIG. 7.

During test operation, a signal "1" is input to test control signal input terminal 122*b* and switch SW3 is set to OFF by the output "0" of test control circuit 121, isolating output buffer 115 from common data output terminal 118. In addition, the output of test control circuit 121 is further controlled by the test input data. A signal "1" is input to terminal 122*a*, switch SW1 set to ON and switch SW2 set to OFF when the test input data is "1". Then the output from AND circuit 116 is output from common data output terminal 118. Conversely, when the test input data is "0", a signal "0" is input to terminal 122*a*, switch SW2 is set to ON, switch SW1 is set to OFF, and the output from OR circuit 117 is output from common data output terminal 118. When the test input data is "1", the data read from each of the 4 memory cells should be "1" in each case, but if even one of them has become "0" through malfunction, the logical product output from AND circuit becomes "0". Consequently there is no need to check the logical sum. On the other hand, when the test data is "0" the data read from each of the 4 memory cells should be "0" in each case, which is the reverse of the above situation. If even one of them has become "1", the logical sum becomes "1". Consequently there is no need to check the logical product. It is sufficient just to compare the output of OR circuit 117 with the test input data. Taking note of this, in this embodiment the outputs of AND circuit 116 and OR circuit 117 are output selectively in accordance with the test input data, as the same way of the embodiment explained in FIGS. 7 and 8.

Figure 11:
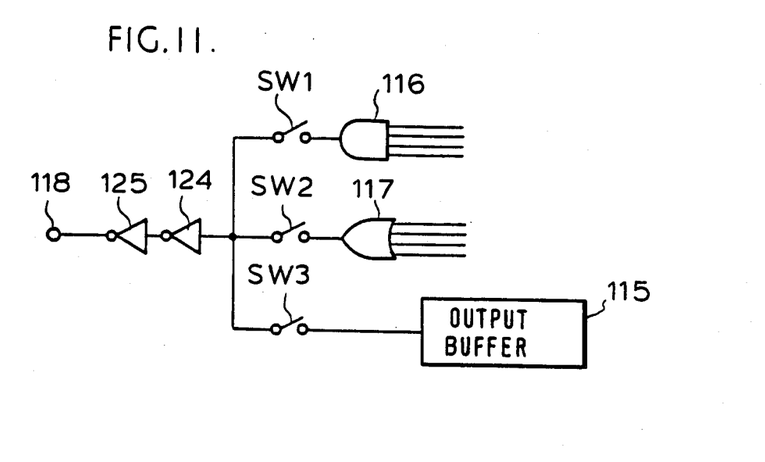
FIGS. 11–12 each show different embodiments of the invention.
Figure 12:
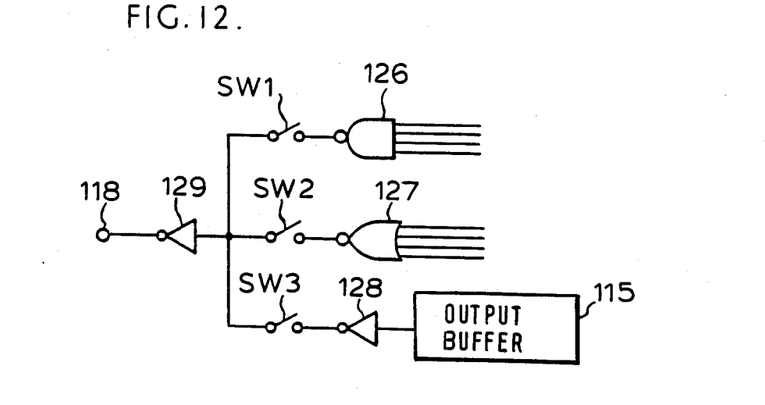

FIG. 11 shows a further embodiment of the invention. This has inverters 124, 125 installed between switches SW1–SW3 and common data output terminal 118 in FIG. 9, so that sufficient drive is possible even if the common data output terminal is connected to a large external load. Furthermore, as shown in FIG. 12, NAND circuit 126 and NOR circuit 127 may be set up instead of AND circuit 116 and OR circuit 117, and together with these, an inverter 128 is connected to the output terminal of output buffer 115, with the output of each of the above circuits being inverted by an inverter 129 and supplied to common data output terminal 118. This type of construction operates in the same way as the embodiments above, and, of course, gives the same results.

In the above embodiments, writing identical data simultaneously to 4 memory cells is described, but it goes without saying that they are also applicable to different numbers (for example 8 memory cells). Furthermore, this invention is not just applicable to semiconductor memory devices, but may also be applied to memory blocks in CPU chips, etc.

As stated above, because this invention inspects several memory cells for correct operation simultaneously, the time required for testing is reduced to approximately ¼, so that the test time for a 1M bit dynamic RAM is equivalent to that for a 256K bit dynamic RAM. Moreover, if 8 memory cells are tested simultaneously, the test time becomes roughly ⅛. The number of memory cells applied this method is not fixed, and should be determined so as to correspond to the chip design.

In the above embodiments, this invention which simultaneously inspects several memory cells in one chip is described, but it goes without saying that they are also applicable to inspecting several memory chips simultaneously. As stated above, if 4 memory chips are tested simultaneously, the time required for testing is reduced to approximately ¼. Moreover, if 8 memory chips are tested simultaneously, the test time becomes roughly ⅛. The number of memory chips applied this method is not fixed, and should be determined so as to correspond to the chip test system design.

In order to apply this invention, it is necessary to add AND circuits, OR circuits, switches, etc., but increases in pattern area and circuit complexity are insignificant, and can be virtually disregarded.

As described above, with this invention, a memory test circuit is obtained which enables testing even at the finished product stage after assembly, and which, moreover, carries out complete testing in a short time.

What is claimed is:

1. A memory test circuit comprising:
   means for simultaneously writing identical test data to several memory cells;
   means for simultaneously reading said test data written to said memory cells;
   means for obtaining a first logical product operation of said test data read from said memory cells;
   means for obtaining a second logical sum operation of said test data read from said memory cells; and
   means for inspecting whether or not said memory cells having written test data operate correctly on the basis of said first logical product operation and second logical sum operation of said test data read from said memory cells;
   wherein said memory test circuit further comprises means for obtaining an exclusive logical sum of said logical product and logical sum of said test data and wherein an inspection of whether or not said memory cells having written test data operate correctly is carried out on the basis of said exclusive logical sum.

2. A memory test circuit according to claim 1, wherein an inspection of whether or not said memory cells written said test data operates correctly is carried out on the basis of a comparison of said test data with said logical product and logical sum of said test data read from said memory cells.

3. A memory test circuit according to claim 2, wherein said memory test circuit is further provided means for controlling which selects an output of said logical product when said test data written is "1", and an output of said logical sum when said test data written is "0", when comparing said written test data with said logical product and logical sum of said test data read from said memory cells.

* * * * *